United States Patent
Tokuda

(10) Patent No.: US 9,929,224 B2
(45) Date of Patent: Mar. 27, 2018

(54) DISPLAY DEVICE

(71) Applicant: Japan Display Inc., Minato-ku (JP)

(72) Inventor: Naoki Tokuda, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/270,614

(22) Filed: Sep. 20, 2016

(65) Prior Publication Data

US 2017/0186830 A1   Jun. 29, 2017

(30) Foreign Application Priority Data

Dec. 25, 2015 (JP) ................................. 2015-253395

(51) Int. Cl.
*H01L 27/32* (2006.01)
*H01L 51/52* (2006.01)

(52) U.S. Cl.
CPC ...... *H01L 27/3272* (2013.01); *H01L 27/3246* (2013.01); *H01L 51/5246* (2013.01); *H01L 51/5253* (2013.01)

(58) Field of Classification Search
None
See application file for complete search history.

(56) References Cited

U.S. PATENT DOCUMENTS

| 2009/0051274 A1* | 2/2009 | Hayashi ............... H01L 51/5253 313/504 |
| 2010/0253660 A1 | 10/2010 | Hashimoto |
| 2012/0099061 A1* | 4/2012 | Lee .......................... G02B 5/22 349/110 |
| 2016/0064686 A1* | 3/2016 | Odaka ................. H01L 51/5246 257/89 |

FOREIGN PATENT DOCUMENTS

| JP | 2009-283242 | 12/2009 |
| JP | 2010-243647 | 10/2010 |

* cited by examiner

*Primary Examiner* — Hoang-Quan Ho
(74) *Attorney, Agent, or Firm* — Oblon, McClelland, Maier & Neustadt, L.L.P.

(57) ABSTRACT

A display device includes a circuit substrate that is formed of a plurality of layers stacked on each other and including a self-luminous element layer that emits light of controlled luminance from each of a plurality of unit pixels and a counter substrate that includes a light shielding layer that shields the light from the self-luminous element layer and so provided as to face the circuit substrate, and the light shielding layer has an opening so formed in an area shifted from an area facing the self-luminous element layer toward an edge of the counter substrate and along the edge of the counter substrate.

10 Claims, 9 Drawing Sheets

DISPLAY DEVICE

CROSS-REFERENCE TO RELATED APPLICATION

The present application claims priority from Japanese application JP2015-253395 filed on Dec. 25, 2015, the content of which is hereby incorporated by reference into this application.

BACKGROUND OF THE INVENTION

1. Field of the Invention

The present invention relates to a display device.

2. Description of the Related Art

JP 2010-243647 A discloses a display device including a circuit substrate having a display layer (self-luminous element layer) and a counter substrate so provided as to face the circuit substrate and having a color filter and a black matrix. JP 2009-283242 A discloses a technology for providing an insulating film contained in a circuit substrate with a cut section that forms a moisture shielding structure to prevent any moisture having entered a display device through the insulating film having moisture permeability from reaching an organic layer (self-luminous element layer).

If moisture enters the display device through the edge of the counter substrate via the black matrix having moisture permeability, and the moisture reaches the self-luminous element layer, display failure could undesirably occur.

SUMMARY OF THE INVENTION

In view of the problem described above, an object of the invention is to prevent occurrence of display failure due to entry of moisture into a display device.

A display device according to an aspect of the invention includes a circuit substrate that is formed of a plurality of layers stacked on each other and including a self-luminous element layer that emits light of controlled luminance from each of a plurality of unit pixels and a counter substrate that includes a light shielding layer that shields the light from the self-luminous element layer and so provided as to face the circuit substrate, and the light shielding layer has an opening so formed in an area shifted from an area facing the self-luminous element layer toward an edge of the counter substrate and along the edge of the counter substrate.

A display device according to another aspect of the invention includes a circuit substrate that is formed of a plurality of layers stacked on each other and including a self-luminous element layer that emits light of controlled luminance from each of a plurality of unit pixels and a counter substrate that includes a light shielding layer that shields the light from the self-luminous element layer and so provided as to face the circuit substrate, at least one of the plurality of layers has a cut section cut along an edge of the circuit substrate, and an edge of the light shielding layer is provided in a position shifted from a cut surface that is one of cut surfaces of the cut section and is closer to the self-luminous element layer toward an edge of the counter substrate.

DETAILED DESCRIPTION OF THE INVENTION

First to six embodiments of the invention will be described below with reference to the drawings.

Figure 1:
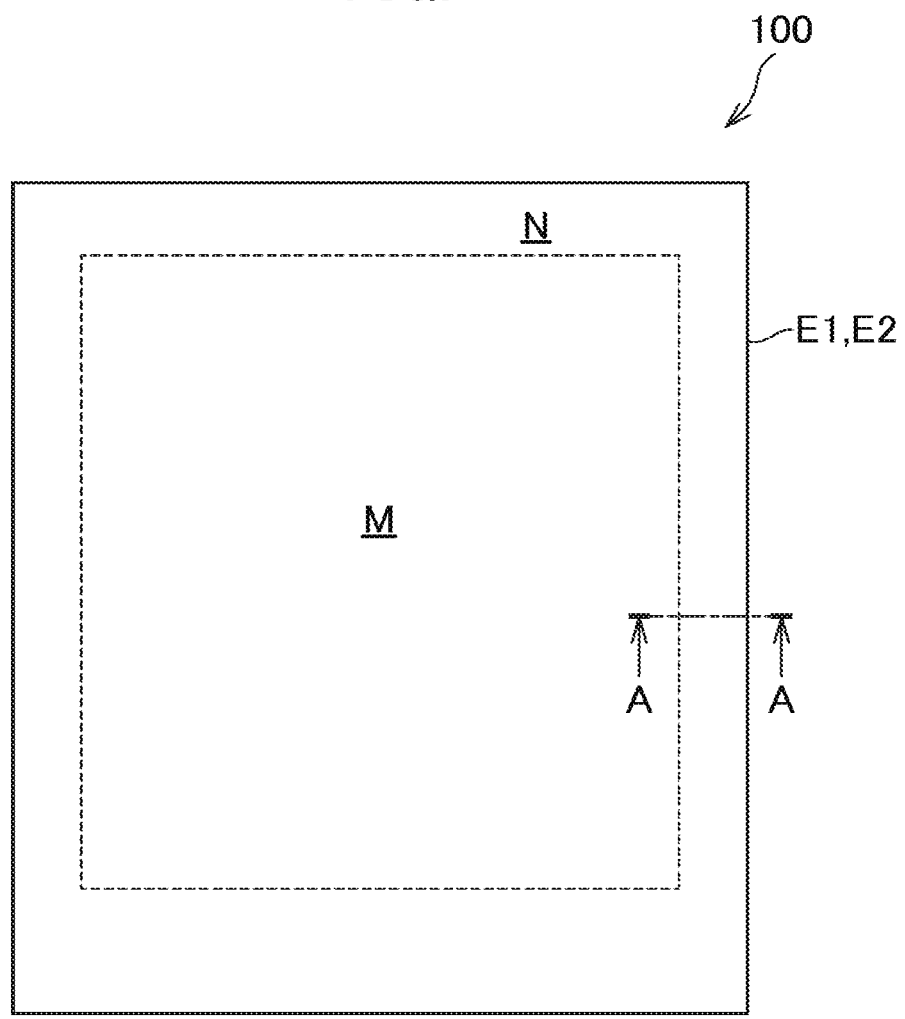
FIG. 1 is a diagrammatic plan view diagrammatically showing an overall configuration of a display device according to each of first to sixth embodiments.
Figure 2:
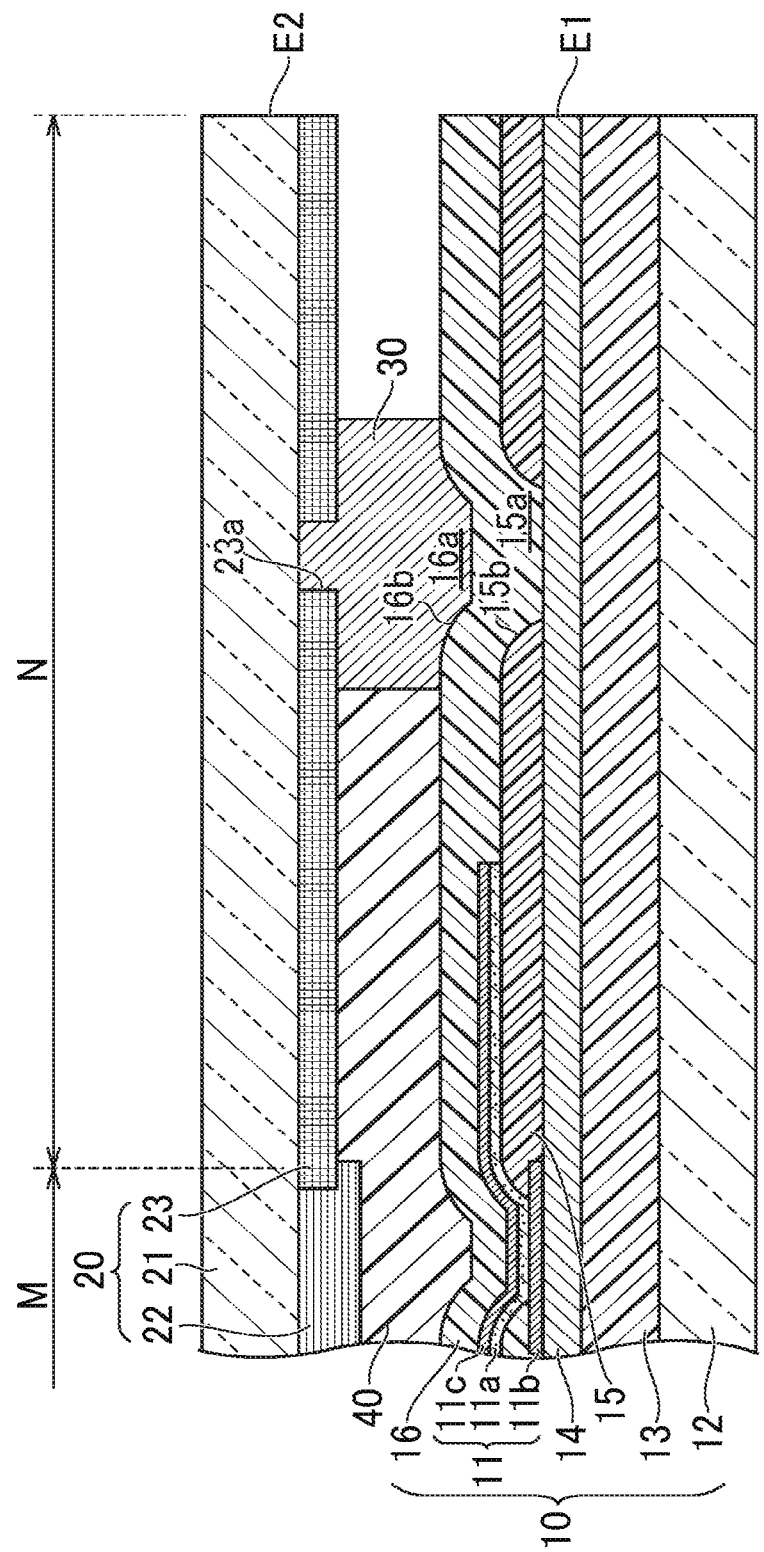
FIG. 2 is a cross-sectional view taken along the line A-A in FIG. 1 and diagrammatically shows a cross section of the display device according to the first embodiment.

A display device 100 according to a first embodiment will first be described with reference to FIGS. 1 to 4. FIG. 1 is a diagrammatic plan view diagrammatically showing an overall configuration of the display device according to the first embodiment. FIG. 2 is a cross-sectional view taken along the line A-A in FIG. 1 and diagrammatically shows a cross section of the display device according to the first embodiment.

The display device 100 has a roughly rectangular display area M (within broken line in FIG. 1), where an image is displayed, and a peripheral area N, which is outside the display area, as shown in FIG. 1. In the display area M, a plurality of unit pixels are arranged in a matrix. Each of display devices according to the second to sixth embodiments, which will be described later, has the same overall configuration as the configuration shown in FIG. 1.

The display device 100 includes a TFT (thin film transistor) substrate 10, which includes thin film transistors and other components, and a counter substrate 20, which is so provided as to face the TFT substrate 10, as shown in FIG. 2. The counter substrate 20 is so provided as to be bonded to the TFT substrate 10 via a seal member 30, which is formed in the peripheral area N and along an edge E1 of the TFT substrate 10, and a filler layer 40, which fills an area surrounded by the seal member 30.

The TFT substrate 10 is formed of a plurality of layers including a self-luminous element layer 11. Specifically, the TFT substrate 10 is formed of a glass substrate 12, a planarizing film 13, which is formed on the glass substrate 12, an insulating film 14, which is formed on the planarizing film 13, a bank layer 15, which is formed on the insulating film 14, the self-luminous element layer 11, which is formed on the bank layer 15, and a sealing film 16, which is formed on the bank layer 15 and the self-luminous element layer 11. Among the plurality of layers, at least the planarizing film 13 and the bank layer 15 are each an organic film made, for example, of a resin and have moisture permeability. The bank layer 15 is so disposed as to separate the plurality of unit pixels from one another.

The self-luminous element layer 11 is a layer that emits light of controlled luminance from each of the plurality of unit pixels that form pixels. The self-luminous element layer 11 is a layer that is provided at least in the display area M and has an organic EL (electroluminescence) layer 11a, a lower electrode 11b, which is a transparent electrode provided as a layer below the organic EL layer, and an upper electrode 11c, which is a transparent electrode provided as a layer above the organic EL layer. An area that forms the organic EL layer 11a and covers the lower electrode 11b forms a light emitting area, and an area set apart by the bank layer 15 from the lower electrode 11b forms a non-light-emitting area.

The organic EL layer 11a is formed of an electron transport layer, a light emitting layer, and a hole transport layer sequentially stacked on each other from the cathode side toward the anode side. In the first embodiment, a configuration in which the lower electrode 11b functions as the cathode and the upper electrode 11c functions as the anode is employed. When DC voltage is applied between the lower electrode 11b and the upper electrode 11c, holes injected from the upper electrode 11c (anode) and travelling via the hole transport layer and electrons injected from the lower electrode 11b (cathode) and traveling via the electron transport layer reach the organic EL layer 11a, where the electrons and the holes recombine with each other. The recombination of the electrons and the holes causes the organic EL layer 11a to emit light of a predetermined wavelength.

Since the bank layer 15 has moisture permeability, moisture having penetrated the bank layer 15 enters the display device 100 from the bank layer 15 in some cases. If the moisture reaches the self-luminous element layer 11, display failure could undesirably occur. In preparation for the situation in which moisture enters the display device 100 through the bank layer 15, the bank layer 15 has a cut section 15a, which forms a moisture shielding structure for preventing the moisture from reaching the self-luminous element layer 11.

The cut section 15a of the bank layer 15 is formed in a position shifted from the self-luminous element layer 11 toward the edge E1 of the TFT substrate 10 and along the edge E1 of the TFT substrate 10. Therefore, even if moisture externally penetrates the bank layer 15, entry of the moisture across the cut section 15a into the self-luminous element layer 11 is avoided.

A groove 16a is formed in the sealing film 16, which is formed on the bank layer 15, in such a way that the groove 16a follows the shape of the cut section 15a of the bank layer 15. In the first embodiment, the seal member 30 is so formed as to enter the groove 16a in the sealing film 16, as shown in FIG. 2.

Although not shown in FIG. 2, to form another moisture shielding structure in the planarizing film 13 having moisture permeability, a cut section may be formed in a position shifted from the self-luminous element layer 11 toward the edge E1 of the TFT substrate 10 and along the edge E1 of the TFT substrate 10. Further, the number of moisture shielding structures formed in the bank layer 15 and the planarizing film 13 is not limited to one, and a plurality of cut sections each of which forms a moisture shielding structure may be provided in each of the layers.

On the other hand, the counter substrate 20 includes a glass substrate 21, a color filter 22, which is provided as a layer below the glass substrate 21, and a black matrix 23, which is provided around the color filter 22.

The color filter 22 is so provided as to be segmented in correspondence with the unit pixels arranged in the display area M, and each of the segmented sections absorbs light of a specific wavelength and transmits light of the other wavelengths. The color filter 22 may, for example, be colored red R, green G, and blue B. The black matrix 23 is so formed in a matrix as to surround the colored sections of the color filter 22 and shields the light from the self-luminous element layer 11.

Figure 3:
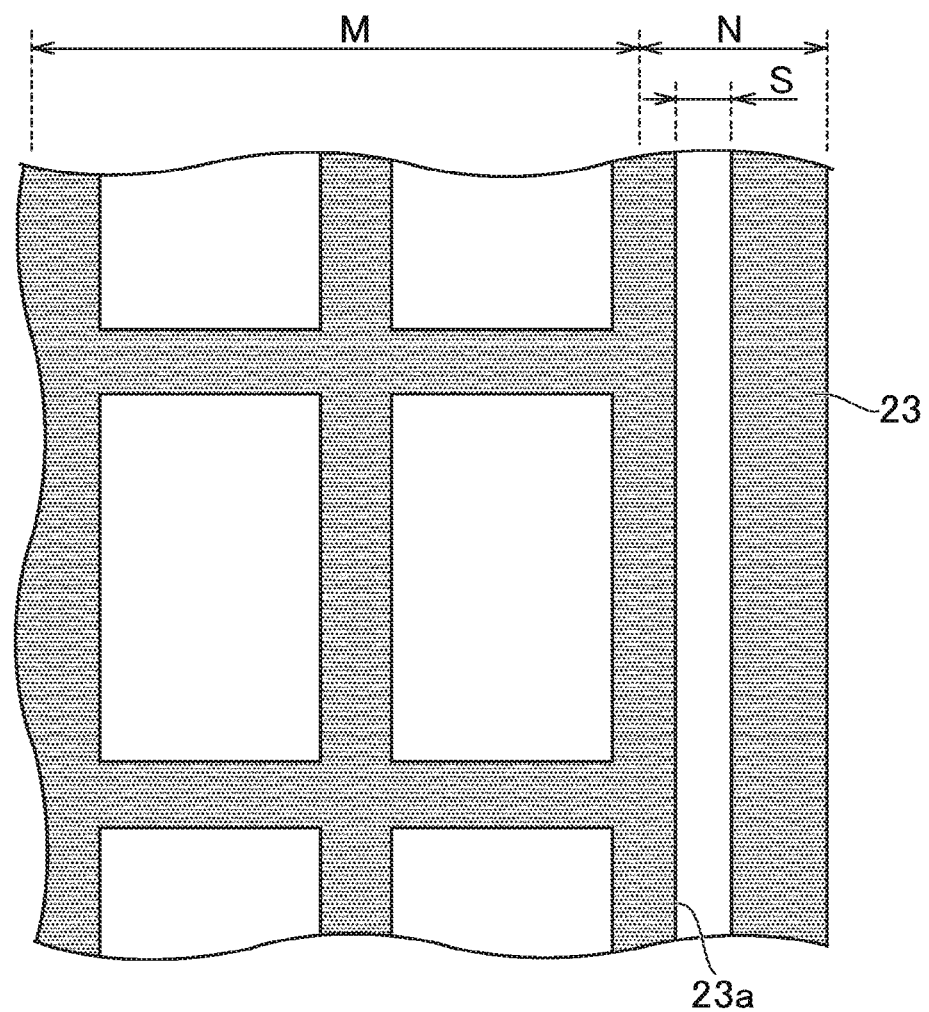
FIG. 3 is an enlarged plan view showing a black matrix in the vicinity of a peripheral area.

The black matrix 23 will be further described in detail with reference to FIGS. 2 and 3. FIG. 3 is an enlarged plan view showing the black matrix in the vicinity of the peripheral area N in the first embodiment. Black matrix in each of the second to fifth embodiments, which will be described later, also employs the same configuration shown in FIG. 3.

The black matrix 23 has moisture permeability. The moisture having passed through an edge E2 of the counter substrate 20 and penetrated the black matrix 23 enters the display device 100 from the black matrix 23 in some cases. If the moisture reaches the self-luminous element layer 11, display failure could undesirably occur.

To avoid the problem described above, the black matrix 23 has a slit 23a formed in a position shifted from the area facing the self-luminous element layer 11 toward the edge E2 of the counter substrate 20 and along the edge E2 of the counter substrate 20. Therefore, even if moisture externally penetrates the black matrix 23, entry of the moisture across the slit 23a into the self-luminous element layer 11 is avoided.

The width S of the slit 23a preferably ranges from about several tens of micrometers to several hundreds of micrometers. In the first embodiment, the slit 23a is formed along the seal member 30, and the seal member 30 is so formed as to fill the slit 23a. The seal member 30 is made of a material that is more unlikely to transmit moisture than the materials of the black matrix 23 and the filler layer 40.

Figure 4:
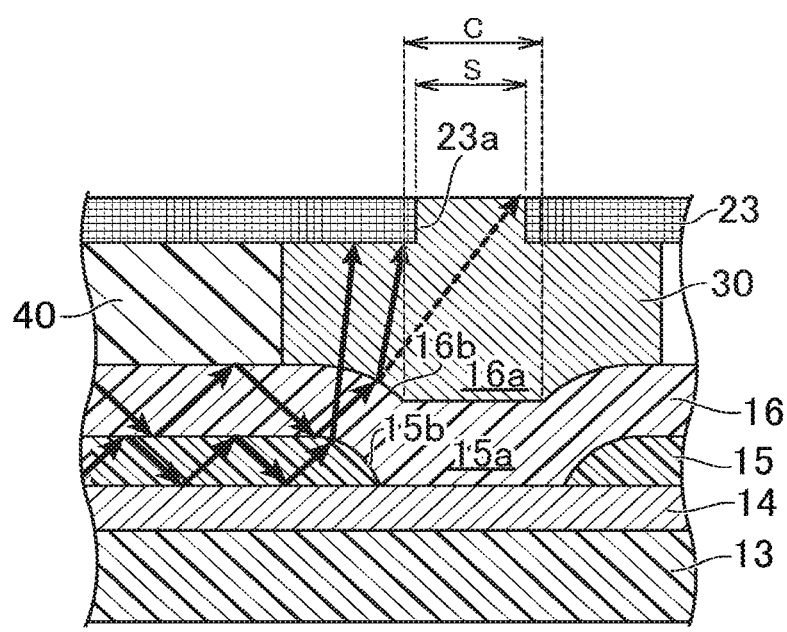
FIG. 4 is a descriptive diagram for describing refraction of light from a self-luminous element.

A light leakage prevention structure based on the formation of the slit 23a in the black matrix 23 will be described with reference to FIG. 4. FIG. 4 is a descriptive diagram for describing refraction of the light from the self-luminous element. The solid-line arrows in FIG. 4 represent the optical path of the light.

The black matrix 23 is so provided as to shield the light from the self-luminous element layer 11. However, the slit 23a formed as described above possibly allows unnecessary light to leak through the slit 23a.

In view of the possibility described above, in the first embodiment, the slit 23a is provided in a position shifted from a cut surface 15b, which is one of cut surfaces of the cut section 15a formed in the bank layer 15 described above and is closer to the self-luminous element layer 11, toward the edge E2 of the counter substrate 20. Further, the slit 23a is provided in a position shifted from an inner surface 16b, which is one of the inner surfaces of the groove 16a in the sealing film 16 and is closer to the self-luminous element layer 11, toward the edge E2 of the counter substrate 20.

Further, the cut surface 15b is formed as an inclining surface, and the inner surface 1bb is formed as an inclining surface. It is preferable to select materials of the bank layer 15 and the sealing film 16 in such a way that the optical refractive index of the sealing film 16 is smaller than that of the bank layer 15. Also, it is preferable to select materials of the sealing film 16 and the seal member 30 in such a way that the optical refractive index of the seal member 30 is smaller than that of the sealing film 16.

When the configuration described above is employed, the light emitted from the self-luminous element layer 11, which travels toward the upper layers while being refracted at the interfaces between the layers, is so refracted at the interface between the bank layer 15 and the sealing film 16 and the interface between the sealing film 16 and the seal member 30 as to travel toward a portion upstream of at least the slit 23a (portion facing display area M). Unnecessary leakage of the light from the self-luminous element layer 11 through the slit 23a is therefore avoided.

The dotted-line arrow in FIG. 4 indicates the optical path of the light emitted from the self-luminous element layer 11 in a case where the sealing film 16 and the seal member 30 have the same optical refractive index and the light is not refracted at the interface between the sealing film 16 and the seal member 30 but travels straight through the interface. In the case where the light is not refracted at the interface between the sealing film 16 and the seal member 30, the light undesirably leaks through the slit 23a, as shown in FIG. 4.

Further, in the first embodiment, the width S of the slit 23a is set to be smaller than the width C of the groove 16a in the sealing film 16. The same configuration is employed in the other embodiments, which will be described later.

As described above, in the display device 100 according to the first embodiment, which employs the configuration in which the slit 23a is formed in the black matrix 23, a situation in which entry of moisture through the edge E2 of the counter substrate 20 via the black matrix 23 causes the self-luminous element layer 11 to become wet can be avoided. As a result, occurrence of display failure can be avoided, whereby a decrease in the life of the display device 100 can be suppressed. Further, since the light leakage prevention structure, which prevents the light from the self-luminous element layer 11 from leaking through the slit 23a, is employed, a decrease in contrast due to leakage of unnecessary light through the slit 23a and other disadvantageous effects are suppressed for improvement in image quality. That is, in the first embodiment, the moisture shielding structure formed in the TFT substrate 10 also serves as the light leakage prevention structure.

Figure 5:
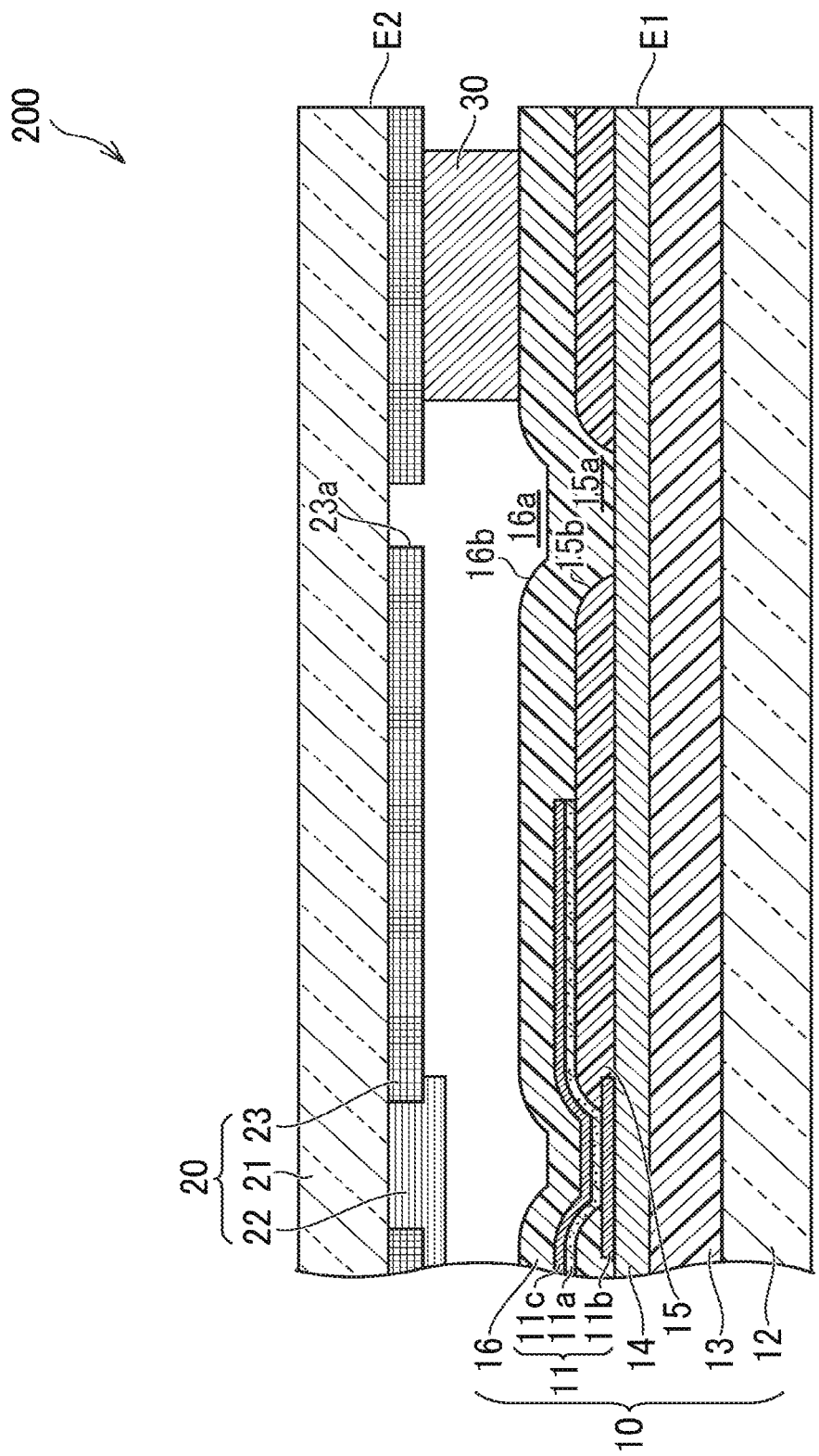
FIG. 5 is a cross-sectional view taken along the line A-A in FIG. 1 and diagrammatically shows a cross section of the display device according to the second embodiment.

A display device 200 according to a second embodiment will next be described with reference to FIG. 5. FIG. 5 is a cross-sectional view taken along the line A-A in FIG. 1 and diagrammatically shows the display device according to the second embodiment. The same configurations as those in the first embodiment have the same reference characters and will not be described.

In the second embodiment, the seal member 30 is provided in a position shifting from the slit 23a in the black matrix 23 toward the edge E1 of the TFT substrate 10. Further, unlike the first embodiment, in which the filler layer 40 is formed in the area surrounded by the seal member 30, the area surrounded by the seal member 30 is a hollow area in the second embodiment. As a result, even if moisture enters the black matrix 23, the moisture is unlikely to reach the self-luminous element layer 11 because the slit 23a is present and no layer that transfers moisture from the black matrix 23 to the sealing film 16 is present.

In the display device 200 according to the second embodiment, since the slit 23a is formed in the black matrix 23, as in the display device 100 according to the first embodiment, even if moisture externally enters the display device 200, the situation in which the moisture reaches the self-luminous element layer 11 can be avoided. As a result, occurrence of display failure can be avoided, whereby a decrease in the life of the display device can be suppressed.

Further, the display device 200 employs the light leakage prevention structure, which prevents the light from the self-luminous element layer 11 from leaking through the slit 23a, as in the first embodiment. The sealing film 16 is preferably made of a material having an optical refractive index smaller than the optical refractive index of the material of the bank layer 15. The sealing film 16 is further preferably made of a material having an optical refractive index greater than the optical refractive index of the hollow area between the TFT substrate 10 and the counter substrate 20. In this case, the light refracted at the interface between the bank layer 15 and the sealing film 16 travels toward the display area M instead of the slit 23a, as in the first embodiment described with reference to FIG. 4, and the light refracted at the interface between the sealing film 16 and the hollow area also travels toward the display area M instead of the slit 23a. Leakage of unnecessary light through the slit 23a can therefore be avoided for improvement in image quality.

Figure 6:
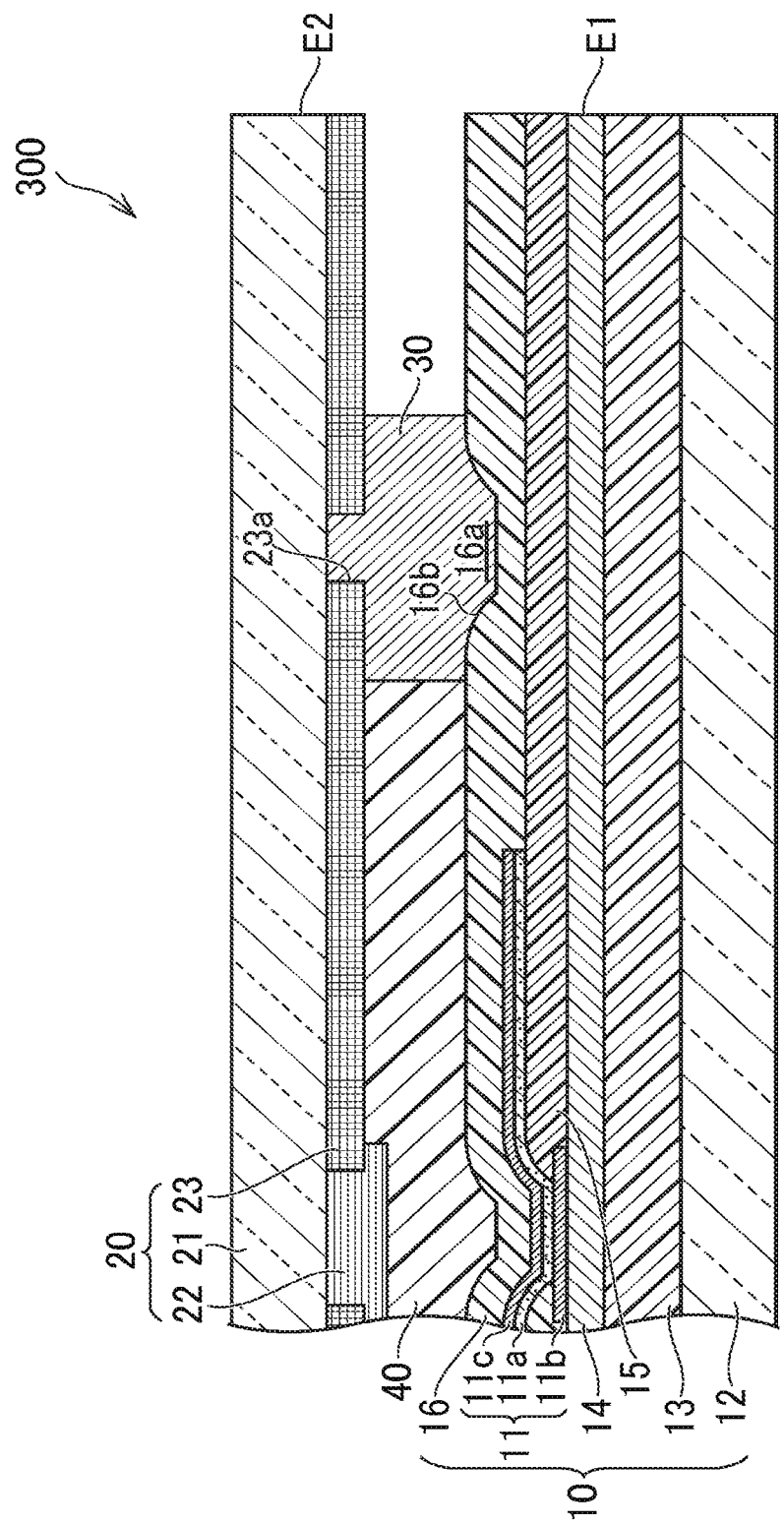
FIG. 6 is a cross-sectional view taken along the line A-A in FIG. 1 and diagrammatically shows a cross section of the display device according to the third embodiment.

A display device 300 according to a third embodiment will next be described with reference to FIG. 6. FIG. 6 is a cross-sectional view taken along the line A-A in FIG. 1 and diagrammatically shows the display device according to the third embodiment. The same configurations as those in the first embodiment have the same reference characters and will not be described.

The display device 300 according to the third embodiment has a configuration in which the bank layer 15 is provided with no cut section 15a, which forms the moisture shielding structure, unlike the display device 100 according to the first embodiment. The groove 16a is formed in the sealing film 16 and along the slit 23a in the black matrix 23. Further, the inner surface 16b of the groove 16a facing the self-luminous element layer 11 is formed as an inclining surface.

In the third embodiment, the seal member 30 is made of a material having an optical refractive index smaller than the optical refractive index of the material of the sealing film 16, and the light refracted at the interface between the sealing film 16 and the seal member 30 therefore travels toward the display area M instead of the slit 23a.

Figure 7:
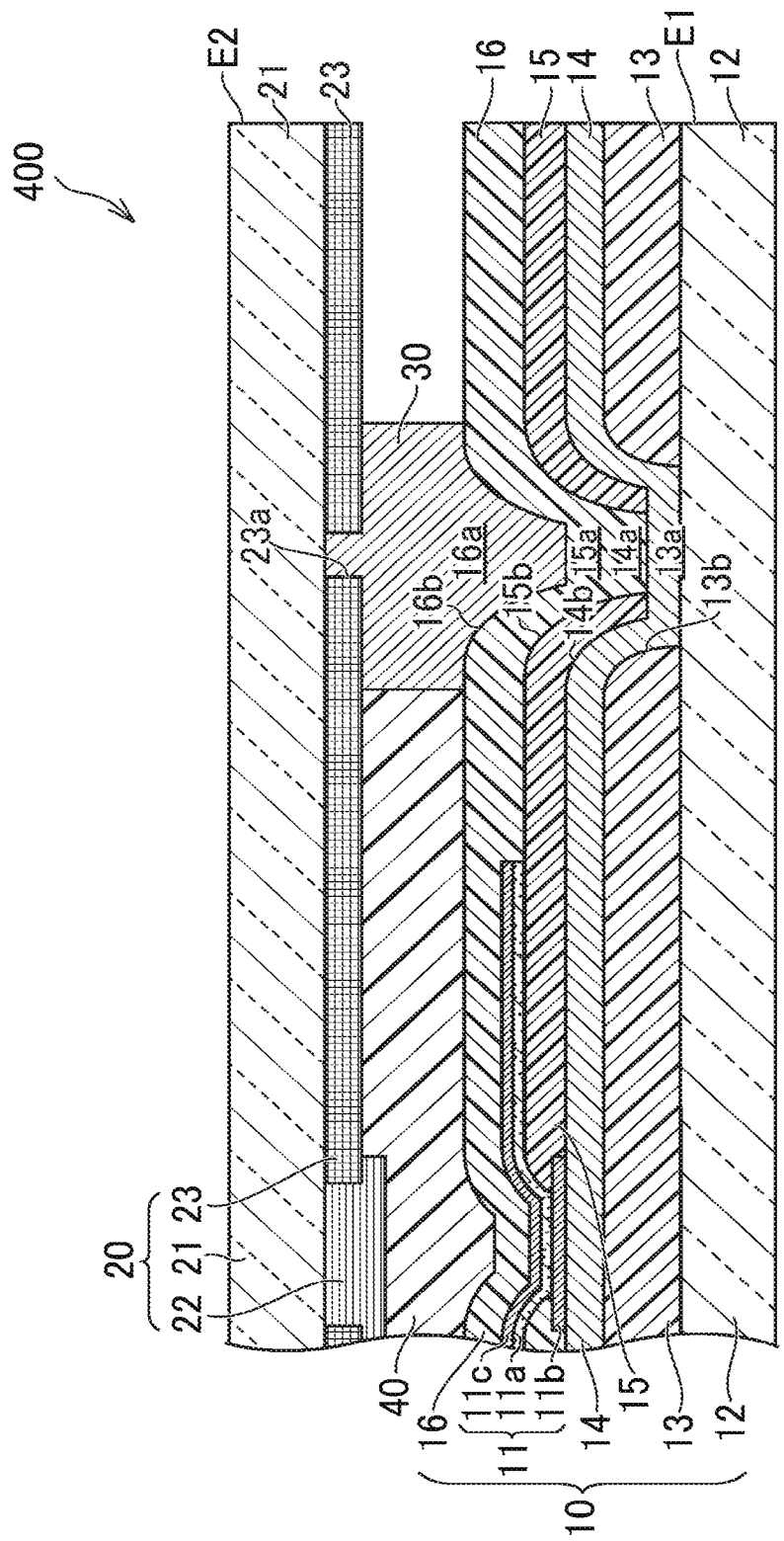
FIG. 7 is a cross-sectional view taken along the line A-A in FIG. 1 and diagrammatically shows a cross section of the display device according to the fourth embodiment.

A display device 400 according to a fourth embodiment will next be described with reference to FIG. 7. FIG. 7 is a cross-sectional view taken along the line A-A in FIG. 1 and diagrammatically shows the display device according to the fourth embodiment. The same configurations as those in the first embodiment have the same reference characters and will not be described.

In the fourth embodiment, a cut section 13a is formed in the planarizing film 13, and the cut section 15a of the bank layer 15 is formed above the cut section 13a. Further, a groove 14a is formed in the insulating film 14, which is formed on the planarizing film 13, in such a way that the groove 14a follows the shape of the cut section 13a of the planarizing film 13, and the groove 16a is formed in the sealing film 16, which is formed on the bank layer 15, in such a way that the groove 16a follows the shape of the cut section 15a of the bank layer 15.

In the fourth embodiment, the slit 23a is provided in a position shifted from the inner surface 16b, which is one of the inner surfaces of the groove 16a in the sealing film 16 and is closer to the self-luminous element layer 11, toward the edge E2 of the counter substrate 20. Further, the width of the slit 23a in the black matrix 23 is set to be smaller than the width of the groove 16a in the sealing film 16.

In the fourth embodiment, which employs the configuration described above, it is expected to provide a better moisture shielding effect than that in the first embodiment, in addition to the effect provided in the first embodiment. The reason for this is that the number of cut sections which are formed in the TFT substrate 10 and each of which forms the moisture shielding structure is greater than the number of cut sections in the first embodiment.

Figure 8:
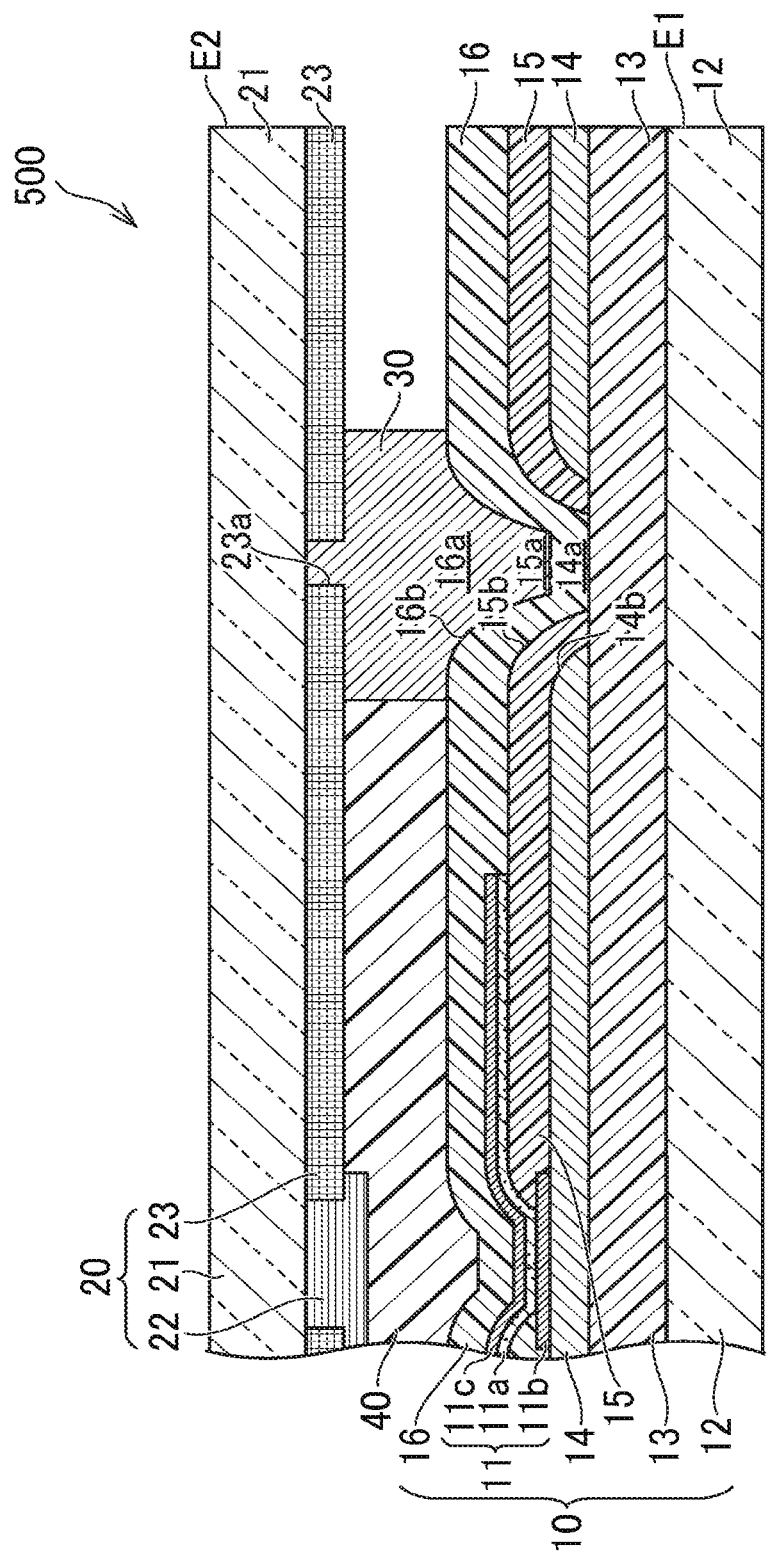
FIG. 8 is a cross-sectional view taken along the line A-A in FIG. 1 and diagrammatically shows a cross section of the display device according to the fifth embodiment.

A display device 500 according to a fifth embodiment will next be described with reference to FIG. 8. FIG. 8 is a cross-sectional view taken along the line A-A in FIG. 1 and diagrammatically shows the display device according to the fifth embodiment. The same configurations as those in the first embodiment have the same reference characters and will not be described.

In the fifth embodiment, the cut section 14a is formed in the insulating film 14, and the cut section 15a of the bank layer 15 is formed on the cut section 14a. The groove 16a is formed in the sealing film 16, which is formed on the bank layer 15, in such a way that the groove 16a follows the shape of the cut section 15a of the bank layer 15.

Further, in the fifth embodiment, the slit 23a is provided in a position shifted from the inner surface 16b, which is one of the inner surfaces of the groove 16a in the sealing film 16 and is closer to the self-luminous element layer 11, toward the edge E2 of the counter substrate 20. Moreover, the width of the slit 23a is set to be smaller than the width of the groove 16a in the sealing film 16.

In the fifth embodiment, which employs the configuration described above, it is expected to provide a better moisture shielding effect than that in the first embodiment in addition to the effect provided in the first embodiment. The reason for this is that the number of cut sections which are formed in the TFT substrate 10 and each of which forms the moisture shielding structure is greater than the number of cut sections in the first embodiment.

Figure 9:
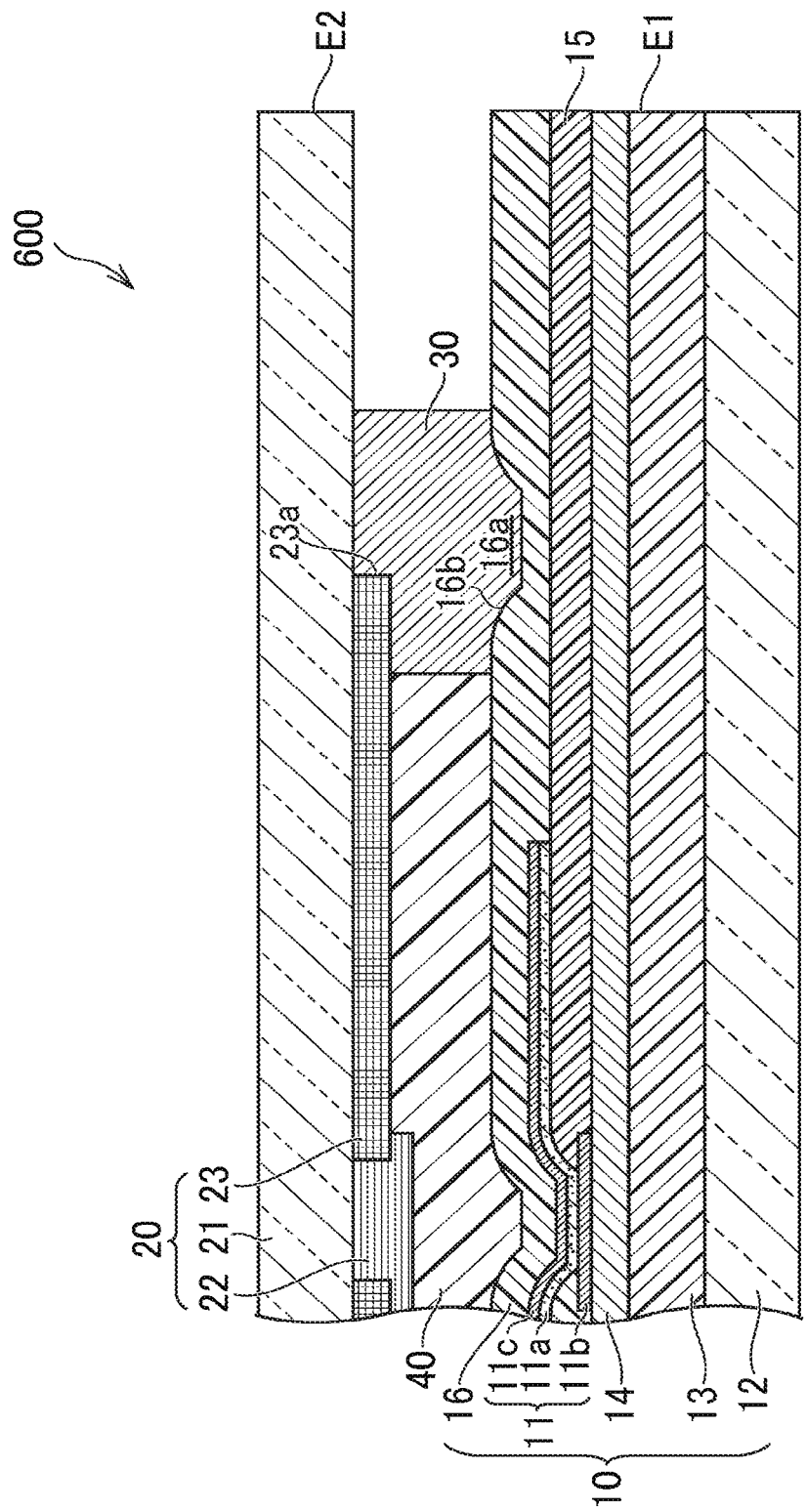
FIG. 9 is a cross-sectional view taken along the line A-A in FIG. 1 and diagrammatically shows a cross section of the display device according to the sixth embodiment.

A display device 600 according to a sixth embodiment will next be described with reference to FIG. 9. FIG. 9 is a cross-sectional view taken along the line A-A in FIG. 1 and diagrammatically shows the display device according to the sixth embodiment. The same configurations as those in the first embodiment have the same reference characters and will not be described.

In the sixth embodiment, an end surface 23b of the black matrix 23 is provided in a position shifted from the cut surface 15b, which is one of the cut surfaces of the cut section 15a of the bank layer 15, which has been described in the first embodiment, and is closer to the self-luminous element layer 11, toward the edge E2 of the counter substrate 20. Further, the seal member 30 is so formed as to cover the end surface 23b of the black matrix 23.

A moisture shielding structure is then so provided that the light refracted at the interface between the bank layer 15 and the sealing film 16 and the interface between the sealing film 16 and the seal member 30 travels toward the display area M instead of the end surface 23b of the black matrix 23. Specifically, the cut surface 15b of the cut section 15a of the bank layer 15 is formed as an inclining surface. It is preferable to select the materials of the bank layer 15 and the sealing film 16 in such a way that the optical refractive index of the material of the sealing film 16 is smaller than that of the material of the bank layer 15. Further, the inner surface 16b of the groove 16a in the sealing film 16 is formed as an inclining surface. It is preferable to select the materials of the sealing film 16 and the seal member 30 in such a way that the optical refractive index of the material of the seal member 30 is smaller than that of the material of the sealing film 16.

In the sixth embodiment, leakage of the light passing by the end of the black matrix 23 can be avoided. Further, no slit 23a is formed in the black matrix 23, whereby manufacturing steps can be simplified accordingly, as compared with the configuration in the first embodiment.

It is noted that the TFT substrate 10 described in each of the above embodiments is a configuration corresponding to the circuit substrate in an aspect of the invention, that the black matrix 23 described in each of the above embodiments is a configuration corresponding to the light shielding layer in an aspect of the invention, and that the slit 23a described in each of the above embodiments is a configuration corresponding to the opening in an aspect of the invention. While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
   a circuit substrate that is formed of a plurality of layers stacked on each other and including a self-luminous element layer that emits light of controlled luminance from each of a plurality of unit pixels; and
   a counter substrate that includes a light shielding layer that shields the light from the self-luminous element layer and so provided as to face the circuit substrate,
   wherein the light shielding layer has an opening so formed in an area shifted from an area facing the self-luminous element layer toward an edge of the counter substrate and along the edge of the counter substrate,
   wherein at least one of the plurality of layers includes a groove formed along an edge of the circuit substrate,
   the opening is provided in a position shifted from an inner surface that is one of inner surfaces of the groove and is closer to the self-luminous element layer toward the edge of the counter substrate, and
   wherein the plurality of layers are configured that a layer provided on an upper side is made of a material having an optical refractive index smaller than an optical refractive index of a material of which a layer provided in a lower side is made.

2. The display device according to claim 1,
   wherein at least one of the plurality of layers has a cut section cut along an edge of the circuit substrate, and
   the opening is provided in a position shifted from a cut surface that is one of cut surfaces of the cut section and is closer to the self-luminous element layer toward the edge of the counter substrate.

3. The display device according to claim 2, wherein the cut surface closer to the self-luminous element layer is an inclining surface.

4. The display device according to claim 2,
   wherein a bank layer that separates the plurality of unit pixels from one another is disposed in the circuit substrate, and
   the at least one layer includes the bank layer.

5. The display device according to claim 4,
   wherein an organic layer is disposed on a side opposite the self-luminous element layer with respect to the bank layer, and
   the at least one layer includes the organic layer.

6. The display device according to claim 1, wherein the inner surface closer to the self-luminous element layer is an inclining surface.

7. The display device according to claim 1,
   wherein a sealing film that covers the self-luminous element layer is disposed on a side that is one of two sides of the self-luminous element layer and faces the counter substrate, and the at least one layer includes the sealing film.

8. The display device according to claim 1, further comprising a seal member provided along the opening and between the circuit substrate and the counter substrate.

9. The display device according to claim 1, further comprising a seal member provided along the opening and between the circuit substrate and the counter substrate, wherein the seal member is made of a material having an optical refractive index smaller than an optical refractive index of a material of an uppermost layer of the plurality of layers.

10. The display device according to claim 1, wherein the counter substrate includes a color filter layer.

* * * * *